United States Patent [19]

Gikow et al.

[11] 3,818,390

[45] June 18, 1974

[54] SUPERCONDUCTIVE TUNABLE FILTER WITH NARROW BAND AND BROAD TUNING RANGE

[75] Inventors: Emanuel Gikow, West Long Branch; John R. Vig, Eatontown, both of N.J.

[73] Assignee: The United States of America as represented by the Secretary of the Army, Washington, D.C.

[22] Filed: Apr. 12, 1973

[21] Appl. No.: 350,660

[52] U.S. Cl. .............. 334/68, 331/107 S, 333/99 S, 334/65, 334/69

[51] Int. Cl. .............................................. H03j 3/22

[58] Field of Search ......... 333/99 S; 334/65, 66, 67, 334/68, 41, 69; 331/107 S

[56] References Cited

UNITED STATES PATENTS

| | | | |
|---|---|---|---|
| 2,780,727 | 2/1957 | Dreyer, Jr. | 334/68 |
| 2,863,998 | 12/1958 | Marie | 333/99 S |
| 2,980,797 | 4/1961 | Million, Jr. | 334/66 X |
| 3,090,920 | 5/1963 | Levine | 334/41 X |
| 3,688,226 | 8/1972 | Mezey | 334/68 |

OTHER PUBLICATIONS

"Transmission Line M Derived Section," by J. J. Lentz, IBM Technical Disclosure Bulletin, Vol. 5 No. 2 July 1962.

*Primary Examiner*—James W. Lawrence
*Assistant Examiner*—Saxfield Chatmon, Jr.
*Attorney, Agent, or Firm*—Edward J. Kelly; Herbert Berl; Arthur L. Bowers

[57] ABSTRACT

A passive, high performance, superconductive LC loop tunable over a very broad tuning range and being capable of a high degree of rejection of undesired signals and wherein inductance and capacitance are adjustable to increase or decrease together by means of a common tuning element and wherein the tuning element has novel configuration for minimal distributed capacitance effect on the inductance to extend the upper frequency limit of the tuner and wherein input and output impedances are relatively constant over the tuning range.

4 Claims, 2 Drawing Figures

SUPERCONDUCTIVE TUNABLE FILTER WITH NARROW BAND AND BROAD TUNING RANGE

BACKGROUND OF THE INVENTION

The near zero resistance of superconductor materials makes it possible to construct high performance resonant circuit devices. However tunable resonant circuit devices of extremely wide frequency range with approximately constant input and output impedance over the frequency range, very narrow band, and with very high degree of rejection of undesired signals have not been available.

DESCRIPTION OF A PREFERRED EMBODIMENT

Figure 1:
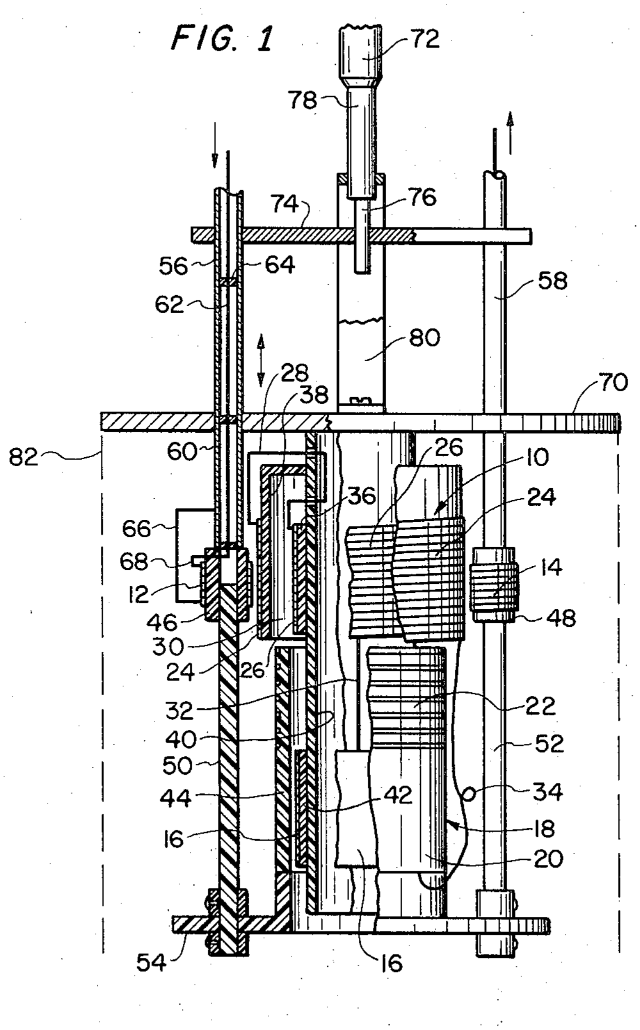
FIG. 1 is side view, partly in section and partly in elevation, of a preferred embodiment.
Figure 2:
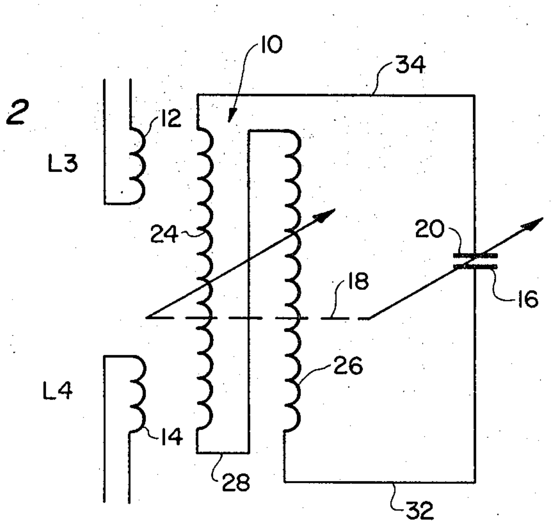
FIG. 2 is a schematic wiring diagram of the tuner shown in FIG. 1.

The illustrated embodiment includes a cylindrical inductor 10 and coupling coils 12 and 14 parallel to and bracketing the inductor, for coupling radio frequency (RF) energy into and out of the inductor but with essentially zero mutual coupling between coils 12 and 14. A cylindrical capacitor electrode 16 is fixedly supported in line with but axially spaced from the inductor. A tuning means 18 in the form of a single rigid component which functions as combined capacitor electrode and inductance attenuator is supported for axial movement for interaction with the inductor 10 and with the cylindrical electrode 16. In one of its end positions, the tuning means 18 fully overlaps electrode 16 and capacitance between them is maximum; in that same end position, tuning means 18 is axially separate from the inductor and the inductance is maximum. In its other end position, the tuning means 18 does not overlap but is axially separate from the cylindrical electrode 16 and the capacitance between them is essentially zero; in that same end position, the tuning means 18 is fully telescoped with and projects slightly beyond the inductor and the inductance is minimum. The spacing between the inductor and the stationary capacitor electrode is sufficient for the tuning means 18 to be fully withdrawn from the inductor when the capacitance electrode 16 is fully overlapped and to be nonoverlapping with capacitance electrode 16 when it is fully telescoped with the inductor. For much of the range of axial adjustment of the tuning means, inductance and capacitance are adjusted in the same direction. With this tuning arrangement, input and output impedance is maintained relatively constant over the entire tuning range, minimizing mismatch losses.

This invention does not require that electrode 16 be a complete cylinder, i.e., that electrode 16 close upon itself, nor that its ends be in planes normal to the cylinder axis. In fact, one design technique to improve linearity of resonant frequency versus position of tuning means 18 is to taper or otherwise shape the end of the electrode 16 nearer the inductor 10, to modify rate of capacitance change as the tuning means 18 starts to overlap with electrode 16 or approaches separation from electrode 16. The tuning means 18 may be made as a single cylindrical component, not shown, or as several in line ring conductors that include capacitance electrode 20 somewhat longer than electrode 16 and inductance changing ring elements 22. The electrode 20 may be designed to underlap, not shown, or to fully overlap electrode 16. The inductance varying elements 22 are axially spaced electrically isolated rings of a diameter that may be the same as or different from the diameter of electrode 20. The inductor turns may be wound with variable spacing to contribute to linearizing the relationship of resonant frequency versus axial position of the tuning means 18; however, if the inductor turns are more loosely wound, leakage inductance is greater and the ratio of maximum to minimum inductance is lessened.

The inductor 10 includes two coils 24 and 26 that are concentric and of essentially equal axial length, not necessarily of equal conductor length, and that are connected series-aiding by a conductor 28. There is a radial gap 30 between the coils no larger than necessary for tuning means 18 to have a snug sliding fit in the radial gap 30; the gap is no greater than necessary to accommodate slidable tuning means 18, so that mutual coupling of the inductor coils is as large as possible. Electrode 16 is a right circular cylinder in FIG. 1 with the same outside diameter as the inner inductor coil 26 and tuning means 18 is dimensioned for a snug sliding fit over the electrode 16. The plurality of ring elements 22 has less distributed capacitance with the inductor when telescoped into the inductor than would a comparable length integral conductor cylinder. It was found that the distributed capacitance is inversely proportional to the number of rings 22 telescoped into the inductor, referenced to a comparable length of single cylinder telescoped into the inductor. A conductor 32 connects the free end of the inner inductor coil 26 to the electrode 16 and an extra length conductor 34 shown with a loop connects the capacitor electrode 20 to the free end of the outer coil 24 of the inductor.

All of the electrical elements described are of superconductor material such as niobium-3-tin ($Nb_3Sn$) or niobium-titanium (NbTi) marketed as wire and foil. A low loss insulator material, such as polycarbonate, that is not deteriorated by exposure to cryogenic temperatures is used for supporting the coils, electrodes, rings and connections. Inner coil 26 is on a support member 36 and coil 24 is on a support member 38 and both support members are bonded to or otherwise secured on a center cylindrical support member 40. Capacitor electrode 16 is of foil formed around support member 42 and has a welded seam. Support member 42 is secured on cylindrical support 40. Capacitor electrode 20 is formed from foil with a welded seam on a support member 44. The support member 44 is as thin as is practical so that the radial separation between the capacitor electrodes is minimal and so that the radial gap between inductor coils is small for tight mutual coupling. The conductor ring elements 22 are of the same foil and have welded seam joints; they are separated along the support member 44 for electrical isolation.

To minimize resistance that may be introduced by the junction points, they should be as few as is practical. Optimally, inductor coils 24, 26 and connecting leads 28, 32, 34 should be made of one continuous conductor. Similarly, each coil 12 and 14 and their respective connecting leads should be of a continuous conductor. Each junction may be made using a technique that includes plasma arc spray mixed powers of niobium and tin on the junction and heat treating to form $Nb_3Sn$. Spot welding in a helium atmosphere, though simpler, produces joints that are somewhat more resistive.

In an alternative construction that is in the scope of this invention, the tuning element 18 may be formed as one integral tubular superconductor or as a bonded stack of a tubular section 20 and rings 22 separated from section 20 and from each other by insulation means. In such construction, the tuning element 18 would have an insulation liner. The electrode 16 would also be of tubular superconductor. Welded seams would not be required. Currently, tubular superconductor stock is not available commercially and thus would have to be custom made.

A large range of inductance is provided by the structures described, for two reasons. As the tuning means 18 telescopes into the gap between the inductor coils, it functions as a shield and decouples the portions of the inner and outer coils with which it is telescoped and so reduce mutual inductance. In addition the ring elements 18 that are telescoped into the inductor function as closely coupled lossless shorted turns and as transformer secondaries. If the coupling coefficient between primary and secondary is K, the effective inductance of the primary is reduced by a factor $1\ (1-K^2)$. If the tuning means 18 is fully inserted and the gap between the inductor coils is small, then K is nearly unity and the inductance change is large.

A close approximation of the maximum inductance is $$L_{max} = N^2R^2/9R + 10h$$

where $L_{max}$ is in microhenries, N is the total number of turns in both inductor coils, R is the average radius, and $h$ is the height of the inductor in inches.

The minimum inductance $L_{min}$ is closely approximated by equating the energy stored in the magnetic field with ($\frac{1}{2} L_{min} i^2$). If the gap distance 30 between the inductor coils is very small compared to inductor height h then the field between the shorted turns and either inductor coil is the same as for a very long solenoid and the field inside the outer coil and outside the inner coil is effectively zero.

Then the inductive tuning ratio is $$\frac{L_{max}}{L_{min}} = \frac{h}{\left[0.9 + \frac{h}{R}\right]\Delta}$$

where $\Delta$ is the gap distance 30.

The significance of this expression is that the smaller the gap between the two inductor coils compared with inductor length, the greater will be the inductance variation. Since a smaller gap is accompanied by a larger inductive tuning ratio, for a smaller gap, a given ratio could be achieved with a smaller tuner.

The range of capacitance change is substantial. Maximum capacitance 16 is related to the area of electrode 16. The area of overlap between the two capacitor electrodes decreases as the tuning means 18 telescopes progressively into the gap between the solenoids. The lumped capacitance is essentially zero when the capacitor electrodes are axially separated. The capacitance at the lowest tuned frequency is stray capacitance in the inductor plus the distributed capacitance between the inductor and the conductor rings 22 of tuning means 18.

Coils 12 and 14 are on hollow cylindrical support members 46 and 48. The support members 44, 46 and 48 are mechanically joined for rectilinear movement together in the axial direction. Rods 50 and 52 are fixedly joined to the coupling coil support members 46 and 48 and a flanged cylindrical member 54 is secured to the free end of support member 44. Rods 50 and 52 extend through and are secured to the flange of member 54 in any suitable manner. Though not shown in FIG. 1, the inside diameter of member 54 may be designed for a sliding fit on center support member 40 for increased structural rigidity; in such case the center support and the support 44 for the tuning means is made longer than shown so that there would be no interference with capacitor electrode 16 and its support member 42.

Coupling coil support members 46 and 48 are secured also to the ends of rigid coax transmission lines 56 and 58. Each transmission line has a stainless steel outer tubular conductor 60 and a copper inner conductor 62 supported in the outer conductor 60 by plastic spacers 64. Conductors 66 and 68 connect the opposed ends of coil 12 to the outer and inner conductors respectively of the coax transmission lines 56. Though not shown in FIG. 1, corresponding connections are made between coil 14 and coax transmission line 58. An antenna system and receiver equipment, both not shown, connect to the other ends of the transmission lines.

Both transmission lines 56 and 58 are slidable in holes formed in a metal plate 70 that is secured to the end of center support 40. Conventional frictional clamping means, not shown, may be included in plate 70 around the transmission lines to lock the tuning assembly in a selected position.

Loading effect of external circuitry on the LC loop is increased with accompanying increase in bandwidth when the coupling coils are positioned closer to the inductor coils. The coupling coils are mounted to move longitudinally with the tuning means 18 in such manner that when the tuner is set for its lowest frequency, the coupling coils are farthest from the longitudinal center of the inductor coils and as the tuner is adjusted for increased frequency, the coupling coils are moved closer to the longitudinal center of the inductor.

The tuning of the LC loop is adjusted by means of a micrometer 72. A cross bar 74 is mechanically connected to the outer conductors of the coax transmission lines. The rod member 76 of the micrometer is connected to the cross bar and the barrel member 78 of the micrometer is fixedly supported by an inverted U-shaped bracket 80 secured to the plate 70. In use the plate 70 is seated on the open end of a dewar 78 indicated by broken lines for containing liquid helium or other liquified gas. Closed cycle refrigerators are available that can provide refrigeration to well below 16 degrees K offering the possibility of using a superconductive tuner as described in a transportable special purpose receiver.

A tuner made according to this description had a broad tuning frequency range, namely 1.3MHz to 23MHz bandwidth, a very high-Q, and was highly selective. An HF receiver operated without the tuner and that had 10 percent cross modulation in response to a 1-volt interfering ±3MHz removed from a tuned-in 100 millivolt signal, upon addition of the single section tuner did not produce the same cross modulation until the interfering signal was within 13KHz of the tuned signal. Dynamic range for a tuner as described is estimated in excess of 140db.

Two or more resonant circuits in accordance with this invention can be electrically coupled to form a tunable filter with greater selectivity. The tuning elements of the plurality of resonant circuits would be mechanically ganged to track together.

We wish it to be understood that we do not desire to be limited to the exact details of construction shown and described, for obvious modifications will occur to a person skilled in the art.

What is claimed is:

1. A tunable resonant loop filter comprising: an inductor that includes two cylindrical coaxial coextensive coils connected in series-aiding and providing a predetermined radial clearance between the coils, a cylindrical capacitor coaxial with said inductor and having one element that is axially spaced from and fixedly positioned relative to the inductor and having a unitary second element movable axially relative to the inductor and to the one capacitor element and having a circular conductor portion at one end for telescoping into the clearance between said two coaxial coextensive coils with a snug sliding fit and operable to reduce both capacitance and inductance in one direction of movement and operable to increase both capacitance and inductance in the other direction of movement, conductor means connecting said inductor and said capacitor as a closed loop, means for locating said second element selectively between two limits along the axis of said inductor and capacitor, in one of the two limits the second element being axially spaced from said one element and extending into the entire extent of clearance between the coils, whereby the capacitance between the two capacitor elements is essentially zero and the inductance of the inductor is minimum, in the other of the two limits the second element being axially spaced from the conductor and overlapping the entire axial length of the one capacitor element whereby capacitance between the capacitor elements is maximum and inductance of the inductor is maximum, and a pair of coupling coils substantially shorter than the inductor supported adjacent to and on opposite sides of the inductor with their axes substantially parallel to and coplanar with the inductor axis.

2. A tunable resonant loop filter as defined in claim 1 wherein the cylindrical portion at the one end of the second element includes a plurality of shorted conductor rings spaced apart axially and electrically isolated from each other, the axial length of the cylindrical portion supporting the shorted axial conductor rings being at least the axial length of said inductor, the remaining length of said second element being at least the axial length of the fixedly positioned capacitor element, the spacing between the inductor and the fixedly positioned capacitor element being such that when the second element completely overlaps the fixedly positioned element, the second element is axially spaced from the inductor, and when the cylindrical portion supporting the shorted rings is fully telescoped in the inductor and extends beyond both ends of the inductor, the second element is axially spaced from the fixedly positioned capacitor element.

3. A tunable resonant loop filter as defined in claim 2 wherein said means is mechanically joined to said coupling coils and is operable to rectilinearly displace said coupling coils together with said second element.

4. A tunable resonant loop filter as defined in claim 3 wherein said inductor coils, capacitor elements, conductor means and said coupling coils are of superconductor material, container means for providing a near zero degrees Kelvin ambiance, said inductor, capacitor, conductor means, and coupling coils being confined within said container means, said locating means extending through said container means and being selectively adjustable outside the container means.

* * * * *